(12) United States Patent
Wei et al.

(10) Patent No.: US 8,841,172 B2
(45) Date of Patent: Sep. 23, 2014

(54) METHOD FOR FORMING PACKAGE SUBSTRATE

(75) Inventors: Shih-Long Wei, Hsinchu County (TW); Shen-Li Hsiao, Hsinchu County (TW); Chien-Hung Ho, Hsinchu County (TW)

(73) Assignee: Viking Tech Corporation, Hsinchu County (TW)

( * ) Notice: Subject to any disclaimer, the term of this patent is extended or adjusted under 35 U.S.C. 154(b) by 70 days.

(21) Appl. No.: 13/593,698

(22) Filed: Aug. 24, 2012

(65) Prior Publication Data

US 2012/0317806 A1 Dec. 20, 2012

Related U.S. Application Data

(62) Division of application No. 13/111,009, filed on May 19, 2011, now abandoned.

(30) Foreign Application Priority Data

Feb. 21, 2011 (TW) ............................. 100105586 A

(51) Int. Cl.
*H01L 21/00* (2006.01)
*H01L 33/64* (2010.01)
*H01L 33/62* (2010.01)

(52) U.S. Cl.
CPC ..... *H01L 33/647* (2013.01); *H01L 2224/48227* (2013.01); *H01L 2933/0075* (2013.01); *H01L 33/62* (2013.01); *H01L 33/641* (2013.01)
USPC ..................................................... 438/121

(58) Field of Classification Search
CPC ..... H01L 33/647; H01L 33/62; H01L 33/641; H01L 33/642; H01L 2224/48227; H01L 2933/0075; H05K 2201/09118; H05K 2203/0108; H05K 3/107
USPC ........ 29/848, 825, 929, 846; 438/26, 28, 688, 438/687, 675, 121
See application file for complete search history.

(56) References Cited

U.S. PATENT DOCUMENTS

| | | | |
|---|---|---|---|
| 4,456,712 A | 6/1984 | Christie et al. | |
| 6,525,942 B2 | 2/2003 | Huang et al. | |
| 6,599,768 B1 * | 7/2003 | Chen | 438/22 |
| 7,345,350 B2 * | 3/2008 | Sinha | 257/449 |
| 8,426,961 B2 * | 4/2013 | Shih et al. | 257/698 |
| 2007/0080360 A1 * | 4/2007 | Mirsky et al. | 257/99 |
| 2010/0127345 A1 * | 5/2010 | Sanders et al. | 257/528 |

* cited by examiner

*Primary Examiner* — Nikolay Yushin
(74) *Attorney, Agent, or Firm* — Shoemaker and Mattare

(57) ABSTRACT

A method of making a package substrate includes steps of forming a plurality of trenches on a first surface of a metal plate, placing insulation material in the trenches, removing metal plate material under the second surface of the metal plate, and exposing the insulation material in the trenches from substrate. The resulting substrate body includes a conductive portion made of the metal plate, and an insulation portion made of the insulation material. The bonding layers on the opposite sides of the substrate are conducted by the conductive portion for heat dissipation, and are separated from one another by the insulation portion.

11 Claims, 5 Drawing Sheets

US 8,841,172 B2

METHOD FOR FORMING PACKAGE SUBSTRATE

This application is a division of copending application Ser. No. 13/111,009, filed May 19, 2011.

FIELD OF INVENTION

The present invention relates to a method for forming a package substrate for increasing heat dissipation.

BACKGROUND OF THE INVENTION

In the development trend of electronic industry, electronic products get thinner and lighter with high performance, function and speed. In addition, it is a trend to enhance beat dissipation to meet requirement of electronic devices with long life.

A conventional package substrate for attaching a light emitting diode (LED) 14 is shown in FIG. 1A and FIG. 1B. A ceramic substrate 10 having a surface 10a and a surface 10b, a bonding layer 13 is formed on the surfaces 10a and 10b of the ceramic substrate 10, and conductive holes 100 are formed through the ceramic substrate 10 for electrically connecting the bonding layer 13 on the surfaces 10a and 10b of the ceramic substrate 10. A light emitting diode 14 is mounted on the bonding layer 13 on the surface 10a of the ceramic substrate 10.

As shown in FIG. 1A, the P electrode and the N electrode of the LED 14 are disposed on the same surface of the LED 14, such that the P electrode and the N electrode of the LED 14 are connected to the bonding layer 13 via wirings 15. Alternatively, as shown in FIG. 1B, the P electrode and the N electrode of the LED 14' are disposed on different surfaces of the LED 14', and thus one electrode is connected to the bonding layer 13 via a wiring 15, and the other electrode is directly and electrically connected to the bonding layer 13.

Heat generates during the operation of the LED 14, 14', and the heat is introduced to the surface 10b of the ceramic substrate 10 is conductive holes 100. In addition the material of the ceramic substrate 10 also facilitates heat dissipation.

However, the conventional ceramic substrate 10 has the coefficient of thermal conductivity as 17-170 w/m·k, which is significantly smaller than that (250 w/m·k) of aluminum material and also smaller than that (400 w/m·k) of copper material. The ceramic substrate 10 has worse thermal conductivity and heat dissipation than metal material. The bonding layer 13 and the conductive holes 100 facilitate heat dissipation, but the volume of the conductive holes 100 is much smaller than that of the ceramic substrate 10. Therefore, the heat dissipation efficiency of the ceramic substrate 10 is not compatible with metal materials.

Accordingly, there is an urgent need to enhance the effect of heat dissipation in the art.

SUMMARY OF THE INVENTION

The present invention involves making a package substrate, including a substrate body having a conductive portion, an insulation portion, and two surfaces opposing to each other; and a plurality of bonding layers formed on the two surfaces of the substrate body, conducted via the conductive portion for heat dissipation, and separated from one another by the insulation portion.

In the package substrate of the present invention, the conductive portion is made of metal material, and the insulation portion is made of polymer or ceramics.

Further, the insulation portions of the present invention may be arranged alternately for dividing the substrate body into a plurality of regions.

In addition, the bonding layer may have a pad for attaching a light emitting diode.

The present invention provides a method for forming a package substrate, including the steps of: providing a metal plate having a first surface and a second surface opposing to the first surface; forming a plurality of trenches on the first surface of the metal plate; providing insulation material in the trenches; removing metal plate material under the second surface of the metal plate, and exposing the insulation material in the trenches from the first and second surfaces of the substrate body to form a substrate body having two surfaces opposing to each other, wherein the substrate body includes a conductive portion made of the metal plate, and an insulation portion made of the insulation material; and forming as plurality of bonding layers on the two surfaces of the substrate body, wherein the bonding layers are conducted via the conductive portion for heat dissipation, and separated from one another by the insulation portion.

In the method of the present invention, the trenches are arranged alternately for dividing the first surface of the metal plate into a plurality of regions.

The method of the present invention further includes the steps of forming the insulation material on the first surface of the metal plate and in the trenches; and removing a portion of the insulation material on the first surface of the metal plate and remaining the insulation material in the trenches.

The present invention further provides a method for forming a package substrate, including the steps of: providing an insulation plate; forming a plurality hollow regions through the insulation plate; providing metal material in the hollow regions to form a substrate body with two surfaces opposing to each other, wherein the substrate body includes a conductive portion made of the metal material, and an insulation portion made of the insulation plate with hollow regions; and forming a plurality of bonding layers on the two surfaces of the substrate body, wherein the bonding layers are conducted via the conductive portion for heat dissipation, and separated from one another by the insulation portion.

In the method of present invention, the hollow regions are arranged alternately to form a plurality of isolated regions.

In the method of the present invention, the metal plate or the metal material is copper (Cu) or aluminum (Al).

In the method of the present invention, the insulation portion is made of polymer or ceramics.

In addition, in the method of the present invention, the bonding layer may have a pad for attaching a light emitting diode.

In the package, the substrate body includes a conductive portion and an insulation portion, and there is a significant ratio of the volume of the conductive portion to the volume of the insulation portion. The volume of the conductive holes in the conventional ceramic plate is extremely small. In contrast, the heat dissipation effect of the substrate body in the present invention is significantly increased to prevent the bonding layer from burn out owing to overheating and to enhance heat dissipation of a light emitting diode.

Moreover, the conductive holes are used as conductive paths in the prior art. In contrast, the conductive portion is the conductive path for the upper and lower bonding layers in the present invention to increase electrical conductivity, and the insulation portion of the present invention prevents the bonding layers from a short circuit.

DETAILED DESCRIPTION OF THE PREFERRED EMBODIMENTS

The following specific examples are used for illustrating the present invention. A person skilled in the art can easily conceive the other advantages and effects of the present invention.

According to the embodiments shown in FIG. 2A to FIG. 2F and FIG. 2A', the terms "above" and "under" are used for illustrating relative direction of the features rather than limiting the scope of the present invention.

FIG. 2A to FIG. 2E show the method for forming a package substrate of the present invention.

Figure 1A:
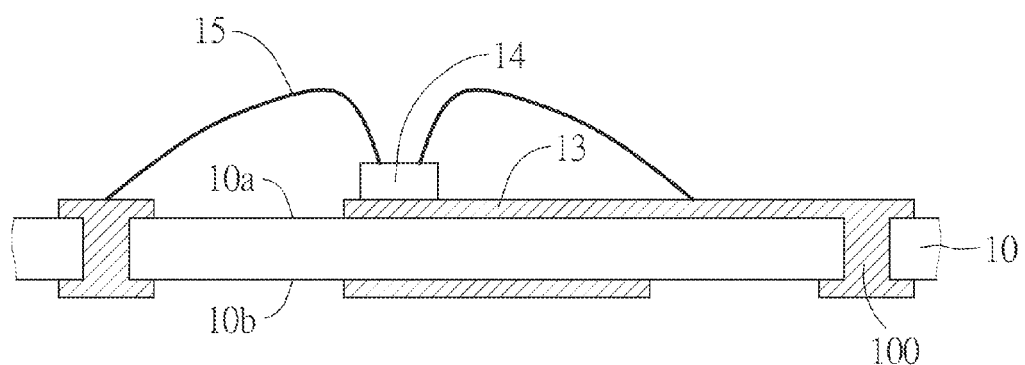
FIGS. 1A and 1B (PRIOR ART) are respectively a cross-sectional schematic view of a light emitting diode (LED) mounted on a package substrate according to different embodiments of the prior art.
Figure 1B:
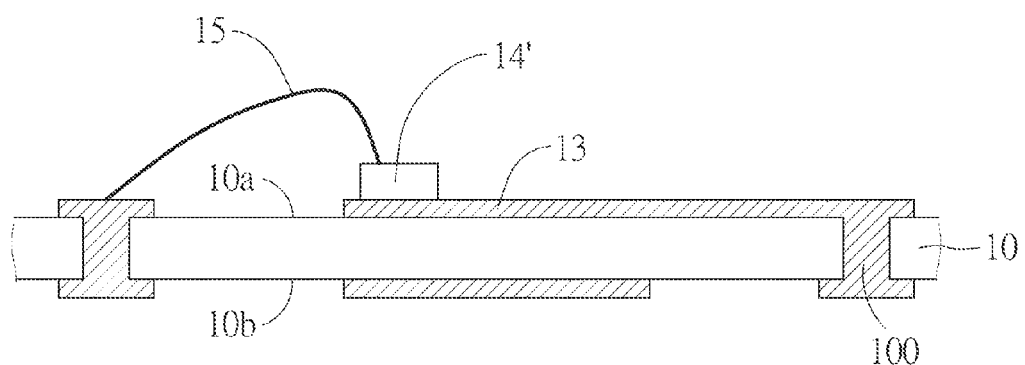
Figure 2A:
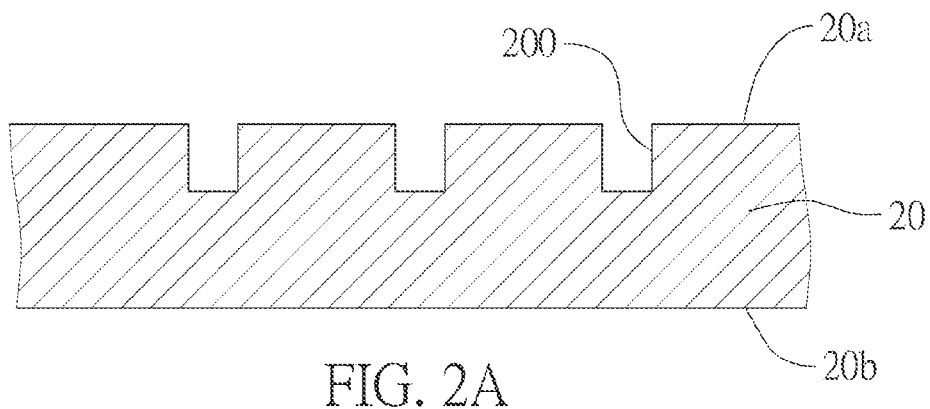
FIGS. 2A to 2E are cross-sectional views showing a method for fabricating a package substrate according to an embodiment of the present invention, wherein FIG. 2A' is a top view of a metal plate.
Figure 2A:
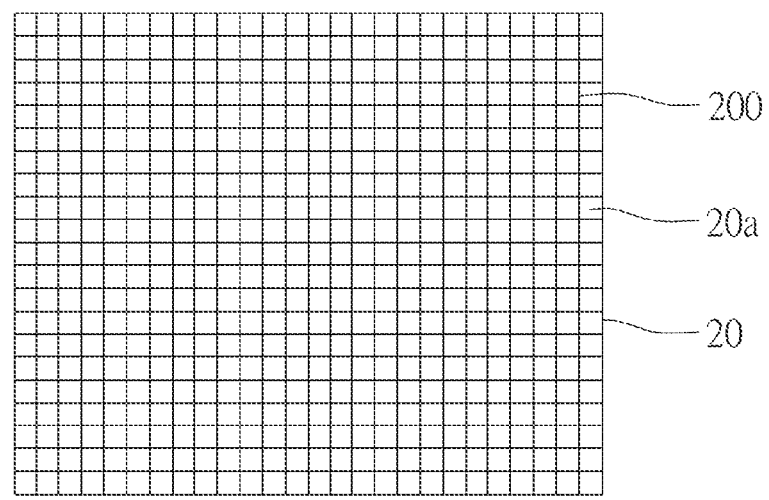

As shown in FIG. 2A and FIG. 2A', a metal plate 20 having a first surface 20a and a second surface 20b opposing to the first surface 20a is provided. The metal plate 20 is made of a thermal conductive material such as copper (Cu) or aluminum (Al). A plurality of trenches 200 are formed on the first surface 20a of the metal plate 20, and the trenches 200 are arranged alternately in high density for dividing the first surface 20a of the metal plate 20 into a plurality of regions as shown in FIG. 2A'.

Figure 2B:
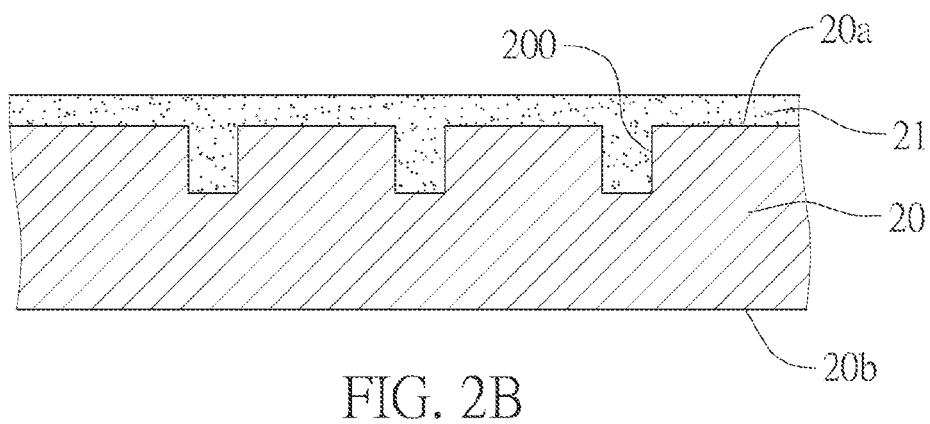

As shown in FIG. 2B, an insulation material 21 is formed on the first surface 20a of the metal plate 20 and in the trenches 200. The insulation material may be polymer such as an epoxy resin, or a ceramic material such as $Al_2O_3$ or AlN.

Figure 2C:
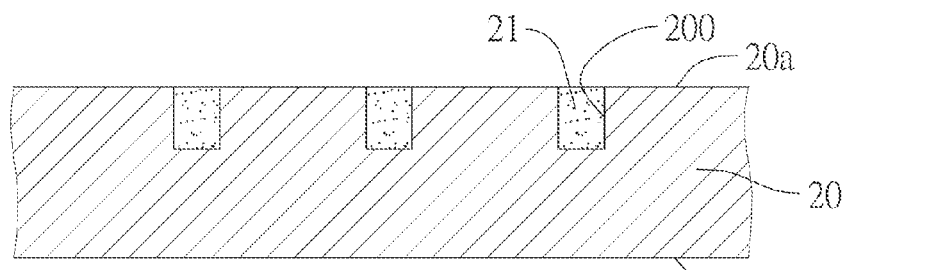

As shown in FIG. 2C, the insulation material 21 on the first surface 20a of the metal plate 20 is removed, and only the insulation material 21 in the trenches is remained.

Figure 2D:
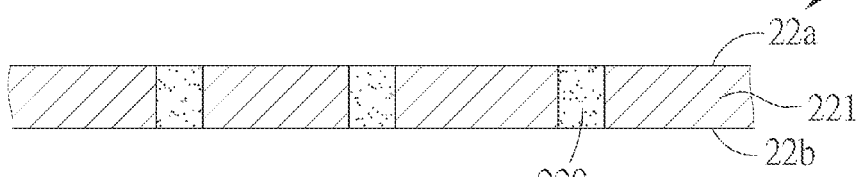

As shown in FIG. 2D, the portion of the metal plate 20 under the second surface 20b of the metal plate 20 is removed, and the remaining metal plate 20 is a conductive portion 221 to form a substrate body 22 having an upper surface 22a and a lower surface 22b. The insulation material 21 in the trenches 200 is exposed from the two surfaces 22a, 22b of the substrate body 22 to form an insulation portion 220. The volume of the conductive portion 221 is larger than the volume of the insulation portion 220.

Figure 2E:
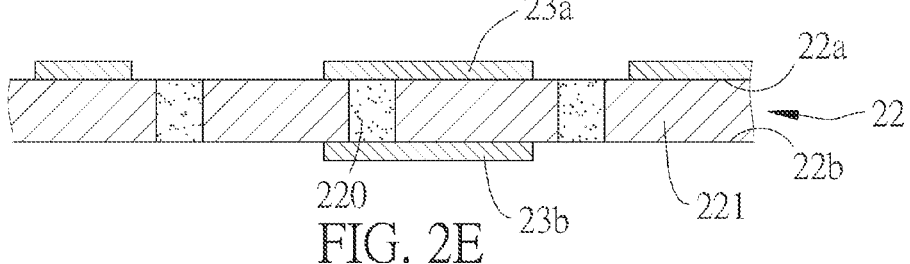

As shown FIG. 2E, bonding layers 23a, 23b are formed on the upper surface 22a and the lower surface 22b of the substrate body 22, and conducted via the conductive portion 221. The bonding layers 23a, 23b are separated by the insulation portions 220 to effectively prevent the bonding layers 23a, 23b from a short circuit.

Figure 2F:
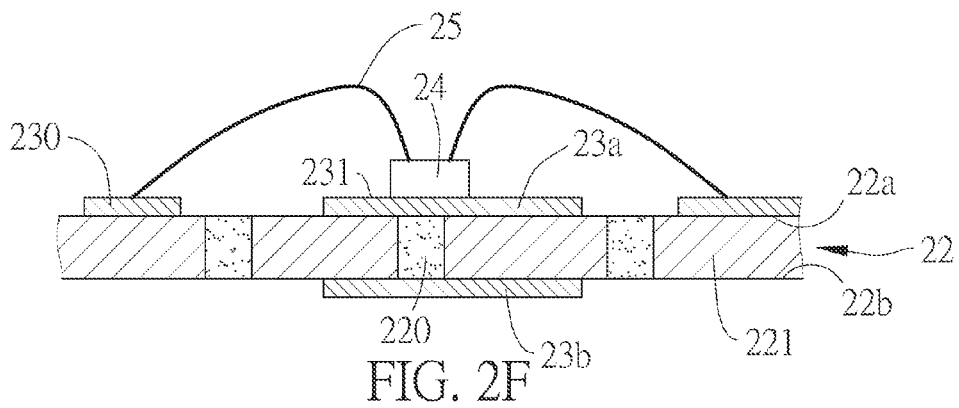
FIGS. 2F and 2F' are respectively a cross-sectional schematic view of an LED mounted on a package substrate according to different embodiments of the present invention.
Figure 2F:
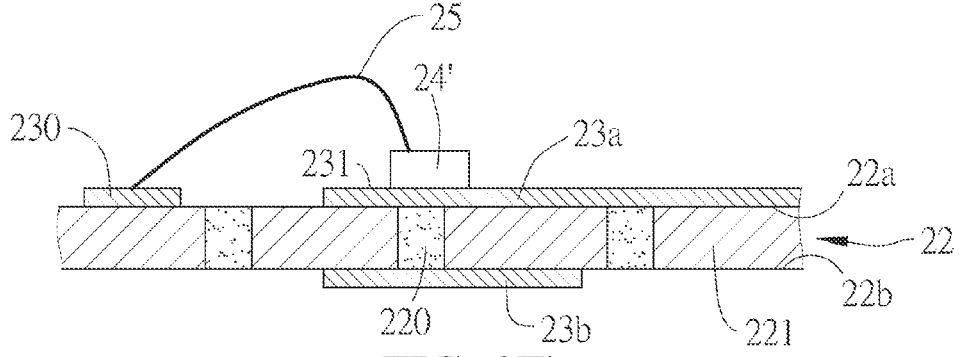

FIG. 2F and FIG. 2F' show an embodiment using the above package substrate. As shown in FIG. 2F, the bonding layer 23a on the surface 22a of the substrate body 22 has electrical connection pads 230 and a pad 231. In the following process, the P electrode and the N electrode are disposed on the same surface of a light emitting diode (LED) 24, which is attached on the pad 231. The P and N electrodes of the light emitting diode 24 are electrically connected to the electrical connection pad 230 by the wiring 25, and the heat dissipation of the LED 24 is performed via the conductive portion 221.

Alternatively, as shown in FIG. 2F', the P electrode and the N electrode are disposed on different surfaces, such as top surface and bottom surface, of a light emitting diode (LED) 24'. The electrode on the top surface of the LED 24' is electrically connected to the electrical connection pad 230 by the wiring 25, and the electrode on the bottom surface of the LED 24' is directly and electrically connected to the bonding layer 23. The heat dissipation of the LED 24' is performed via the conductive portion 221.

The most volume of the substrate body 22 is made of the conductive portion 221 in the present invention. The coefficient of thermal conductivity of metal material is higher than the common material. For example, the coefficient of thermal conductivity of aluminum material is 250 w/m·k, and the coefficient of thermal conductivity of copper material is 400 w/m·k. In comparison with the conventional ceramic substrate, the substrate body 22 of the present invention has much better thermal conductivity and heat dissipation, and thus significantly enhances performance and extends life of the light emitting diodes 24, 24'.

Further, the conductive portion 221 of the present invention is used as a conductive path for the bonding layers 23a, 23b on the upper and lower surfaces. Therefore, the present invention increases electrical conductivity by using only the insulation portion 220, so as to prevent the bonding layers 23a, 23b from a short circuit.

Figure 3A:
FIGS. 3A to 3C are schematic cross-sectional diagrams showing a process of a substrate body of a package substrate according to another embodiment of the present invention, wherein FIG. 3B' is a top view of an insulation plate.
Figure 3B:
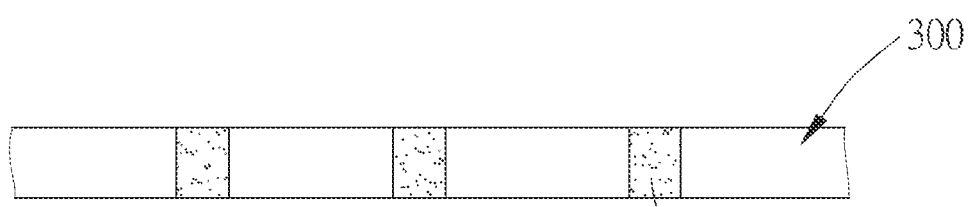
Figure 3B:
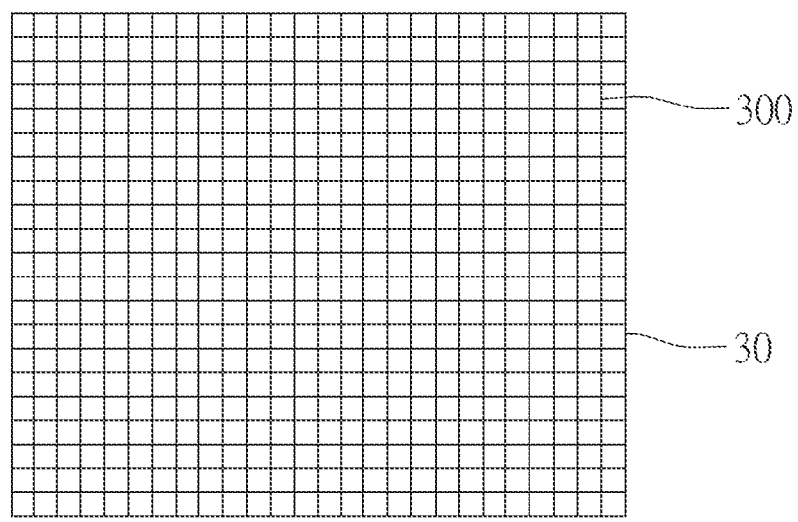
Figure 3C:
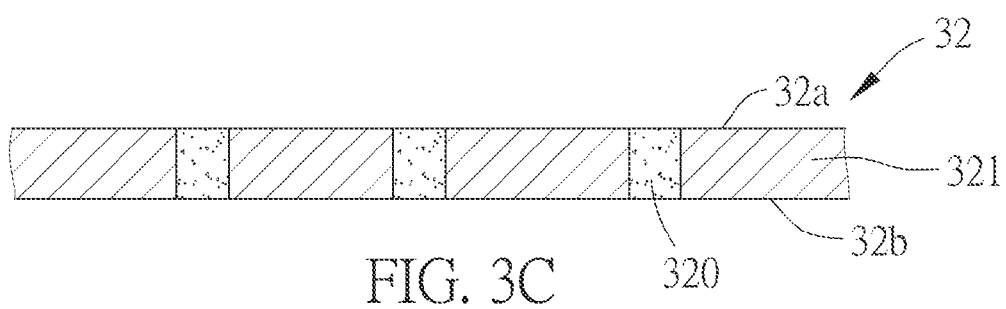

FIG. 3A to FIG. 3C show another embodiment of the method for forming a package substrate in the present invention. This embodiment is similar to the above embodiment except the procedure for forming the substrate body 32. The similar procedure is not described in this embodiment.

As shown in FIG. 3A, an insulation plate 30 is provided.

As shown in FIG. 3B and FIG. 3B', a plurality of hollow regions 300 are formed through the insulation plate 30. The volume of the hollow regions is larger than the volume of the remaining insulation plate 30.

As shown in FIG. 3C, the metal material is formed in the hollow regions 300. For example, the metal material is filled in the hollow regions 300 to form a substrate body 32 having an upper surface 32a and a lower surface 32b. The substrate body 32 includes a conductive portion 321 made of the metal material and an insulation portion 320 through the insulation plate 30. The volume of the conductive portion 321 is larger than the volume of the insulation portion 320.

Figure 4:
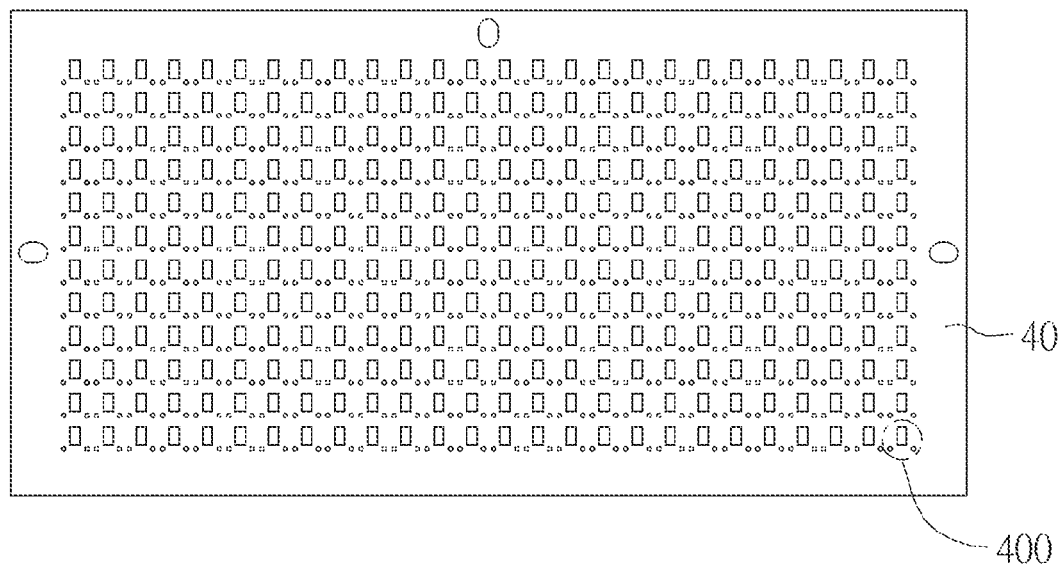
FIG. 4 is a top view of another insulation plate in the process of FIGS. 3A to 3C, wherein FIG. 4' is a partially enlarged view of FIG. 4.
Figure 4:
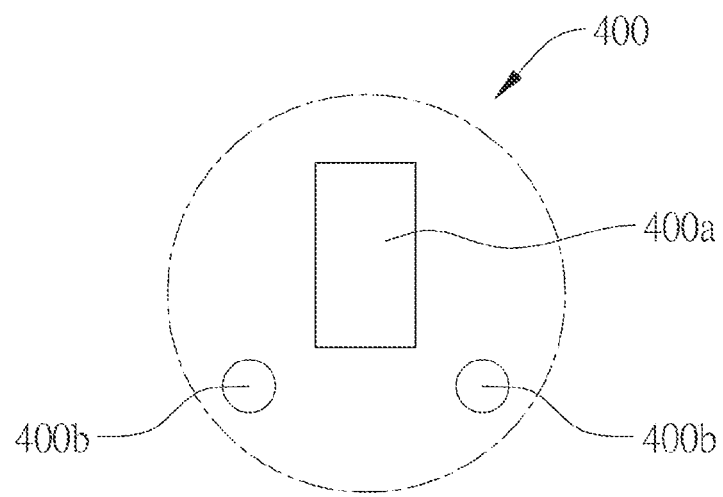

Referring to FIG. 4 and FIG. 4', an insulation plate 40 has a plurality of hollow regions 400 for receiving the metal material. A hollow region 400 includes a rectangular hole 400a and two circular holes 400b disposed at the same side and outside the angle of the rectangular hole 400a. The hollow regions 400 are aligned in an array. In the following procedure, the conductive potion in the rectangular hole 400a is used for carrying a chip and providing a path for heat dissipation of the chip, and the conductive portion in the circular hole 400b is used for electrical connection of the bonding layers on the upper and lower surfaces of the substrate.

As shown in FIGS. 2F and 2F', the present invention further provides a package substrate, including a substrate body 22 having two surfaces 22a, 22b opposing to each other; and bonding layers 23a, 23b respective formed on the surfaces 22a, 22b of the substrate body 22.

The substrate body 22 includes conductive portions 221 and insulation portions 220, and the volume of the conductive portions is larger than the volume of the insulation portions 220. The conductive portion 221 is made of copper or aluminum for heat dissipation. The insulation portions 220 are formed through the surfaces 22a, 22b of the substrate body 22. The insulation portions 220 are arranged alternately for dividing the substrate body 22 into a plurality of regions, wherein the conductive portion 221 is formed in the region. The insulation region 220 is made of polymer or ceramic material.

The bonding layers 23a, 23b are conducted via the conductive portion 221, and separated by the insulation portions 220. Further, the bonding layer 23a has pads 231 for attaching light emitting diodes 24, 24'. The light emitting diodes 24, 24' are electrically connected to the bonding layer 23a, and the heat dissipation of the light emitting diodes 24, 24' is performed via the conductive portion 221.

In the present invention, the volume of the conductive portion of the substrate body is significantly larger than that in the prior art, so as to significantly increase heat dissipation, to prevent the bonding layer from burn out owing to overheating and to extend life of the light emitting diode.

In addition, the conductive portion of the substrate body is the conductive path for the upper and lower bonding layers in the present invention to increase electrical conductivity, and the insulation portion of the present invention prevents the bonding layers from a short circuit.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

We claim:

1. A method for forming a package substrate, comprising steps of:
    providing a metal plate having a first surface and a second surface opposing to the first surface;
    forming a plurality of trenches on the first surface of the metal plate, wherein the trenches are crossed to each other and arranged alternately for dividing the first surface of the metal plate into a plurality of regions;
    providing insulation material in the trenches;
    removing metal plate material under the second surface of the metal plate, and exposing the insulation material in the trenches from the first and second surfaces of the metal plate to form a substrate body having two surfaces opposing to each other, wherein the substrate body includes a conductive portion made of the metal plate, and an insulation portion made of the insulation material; and
    forming a plurality of bonding layers on the two surfaces of the substrate body, wherein the bonding layers are in contact with the conductive portion and the insulation portion so as to be conducted via the conductive portion for heat dissipation, and separated from one another by the insulation portion.

2. The method of claim 1, wherein the metal plate is made of copper or aluminum.

3. The method of claim 1, wherein the insulation portion is made of polymer or ceramics.

4. The method of claim 1, wherein the insulation portion is formed by the steps of:
    forming the insulation material on the first surface of the metal plate and trenches; and
    removing a portion of the insulation material on the first surface of the metal plate and remaining the insulation material in the trenches.

5. The method of claim 1, wherein a volume of the conductive portion is larger than a volume of the insulation portion.

6. The method of claim 1, wherein one from the plurality of the bonding layers has a pad for attaching a light emitting diode.

7. A method for forming a package substrate, comprising steps of:
    providing an insulation plate;
    forming a plurality of hollow regions through the insulation plate, wherein a volume of the hollow regions is greater than a volume of a whole of a remaining portion of the insulation plate, and the hollow regions are arranged alternately to form a plurality of isolated regions in a form of matrix;
    providing metal material in the hollow regions to form a substrate body with two surfaces opposing to each other, wherein the substrate body includes a conductive portion made of the metal material, and an insulation portion made of the insulation plate with hollow regions; and
    forming a plurality of bonding layers on the two surfaces of the substrate body, wherein the bonding layers are conducted via the conductive portion for heat dissipation, and separated from one another by the insulation portion.

8. The method of claim 7, wherein the metal material is copper or aluminum.

9. The method of claim 7, wherein the insulation portion is made of polymer or ceramics.

10. The method of claim 7, wherein a volume of the conductive portion is larger than a volume of the insulation portion.

11. The method of claim 7, wherein one from the plurality of the bonding layers has a pad for attaching a light emitting diode.

* * * * *